United States Patent
Shin

(10) Patent No.: US 8,305,127 B2
(45) Date of Patent: Nov. 6, 2012

(54) DATA DELAY CONTROL CIRCUIT AND METHOD

(75) Inventor: Jong-Chul Shin, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 348 days.

(21) Appl. No.: 12/726,565

(22) Filed: Mar. 18, 2010

(65) Prior Publication Data

US 2010/0182064 A1    Jul. 22, 2010

Related U.S. Application Data

(62) Division of application No. 11/669,296, filed on Jan. 31, 2007, now Pat. No. 7,696,802.

(30) Foreign Application Priority Data

Feb. 1, 2006   (KR) .................... 10-2006-0009805

(51) Int. Cl.
    *H03H 11/26* (2006.01)
(52) U.S. Cl. ........................... 327/261; 327/284
(58) Field of Classification Search .................. 327/161, 327/261, 262, 276, 277, 284
    See application file for complete search history.

(56) References Cited

U.S. PATENT DOCUMENTS

| | | | |
|---|---|---|---|
| 5,087,842 A | 2/1992 | Pulsipher et al. | |
| 5,561,692 A * | 10/1996 | Maitland et al. | 375/371 |
| 6,259,293 B1 | 7/2001 | Hayase et al. | |
| 6,720,811 B2 | 4/2004 | Yazawa et al. | |
| 6,756,833 B2 | 6/2004 | Miura | |
| 7,696,802 B2 * | 4/2010 | Shin | 327/262 |
| 2002/0135394 A1 | 9/2002 | Ahn et al. | |
| 2003/0001650 A1 | 1/2003 | Cao et al. | |

FOREIGN PATENT DOCUMENTS

CN    1677297    10/2005

OTHER PUBLICATIONS

Chinese Patent Application No. 200710007942.2—Rejection Decision.

* cited by examiner

*Primary Examiner* — Long Nguyen
(74) *Attorney, Agent, or Firm* — F. Chau & Associates, LLC

(57) ABSTRACT

A data delay control circuit and method that can adaptively reflect changes in an operating environment, such as an operating temperature, an operating voltage and a manufacturing process of a semiconductor chip. The data delay control circuit is designed to be able to adaptibly delay data when an expected delay of a predetermined period should be required when the semiconductor chip is designed. The data delay circuit includes a clock oscillation unit that can reflect changes in a delay period of a delay cell and automatically adjust the delay period of the delay cell. Since the data delay circuit includes a monitoring circuit and a plurality of delay paths, the data delay circuit can provide a delay path having a desired delay value. Therefore, even when the operating environment of a semiconductor device changes, the data delay circuit can control the delay period of a data signal. Consequently, the data delay circuit can automatically generate a data delay signal according to the changes in the operating environment.

5 Claims, 11 Drawing Sheets

DATA DELAY CONTROL CIRCUIT AND METHOD

This application is a Divisional application of U.S. patent application Ser. No. 11/669,296 filed on Jan. 31, 2007 now U.S. Pat. No. 7,696,802, which claims priority to and the benefit of Korean Patent Application No. 10-2006-0009805, filed on Feb. 1, 2006, in the Korean Intellectual Property Office, the entire contents of both of which are incorporated by reference herein.

BACKGROUND OF THE INVENTION

1. Technical Field

The present disclosure relates to a data delay circuit and, more particularly, to a data delay circuit and a method that can adaptively reflect changes in an operating environment.

2. Discussion of Related Art

Generally, buffers or inverters are connected in a line or delay cells are used to delay data in a system. The delay periods of delay cells, however, are dramatically changed by factors such as a manufacturing process, an operating temperature or an operating voltage that cause the delay periods of delay cells in a minimum delay environment to more than double, as compared to the delay periods of the same delay cells in a maximum delay environment. Therefore, implementing a system using delay cells is not an appropriate way to obtain an expected delay signal.

FIG. 1 illustrates a circuit diagram of a conventional data delay circuit using a plurality of buffers BF.

Referring to FIG. 1, the conventional data delay circuit includes the buffers BFs and a plurality of capacitors CAPs. Because the conventional data delay circuit uses the simple buffers BFs and the capacitors CAPs, changes in an operating environment are directly reflected in the conventional data delay circuit. Therefore, the amount of change in the operating environment accumulates, and the minimum delay environment and the maximum delay environment produce different delay periods.

FIG. 2 illustrates a circuit diagram of a conventional data delay control apparatus. Specifically, FIG. 2 illustrates a conventional select delay circuit outputting a delayed data signal D_OUT in response to an input data signal D_IN.

Referring to FIG. 2, the conventional data delay control apparatus includes a plurality of delay paths DELAY1 through DELAYN and a selector MUX.

The operation of the selector MUX will now be briefly described. The selector MUX selects one of the delay paths DELAY1 through DELAYN according to some external factor and generates the delayed data signal D_OUT having various different delay periods in response to a select signal SEL. A processor (not shown) controls the selector MUX to select one of the delay paths DELAY1 through DELAYN in accordance with the select signal SEL. In this apparatus, however, the last delay path should be selected using the processor, and additional processing by the processor for obtaining necessary information is required for the processor to obtain accurate results. Therefore, without the additional processing by the processor, the conventional data delay control apparatus cannot effectively reflect the amount of change in the delay periods of the delay cells.

SUMMARY OF THE INVENTION

Exemplary embodiments of the present invention provide a data delay circuit and method that can adaptively reflect changes in an operating environment.

According to an exemplary embodiment of the present invention, there is provided a data delay circuit including: an oscillation unit sensing a change in an operating environment and generating a clock signal with a varying frequency according to the change in the operating environment; a delay unit delaying a data signal through a plurality of delay cells and a selector; and a delay select control unit converting a change in the clock signal generated by the clock oscillation unit into a control signal for controlling the delay unit.

In an exemplary embodiment of the present invention, there is provided a data delay method including: sensing a change in an operating environment; generating a control signal in response to the sensed change; selecting one of a plurality of delay signals in response to the control signal; and delaying data using the selected delay signal.

According to an exemplary embodiment of the present invention, there is provided a circuit for controlling a rotation speed of a cooling fan, the circuit including: a clock oscillation unit sensing a change in an operating environment and generating a clock signal with a varying frequency according to the change in the operating environment; the cooling fan whose rotation speed is controlled by an input control signal; and a control unit converting a change in the clock signal generated by the clock oscillation unit into the control signal of the cooling fan.

In an exemplary embodiment of the present invention, there is provided a memory card including: a clock oscillation unit sensing a change in an operating environment and generating a clock signal with a varying frequency according to the change in the operating environment; an input delay unit delaying an input data signal through a plurality of delay cells and a selector; an output delay unit delaying an output data signal through a plurality of delay cells and a selector; and a delay select control unit converting a change in the clock signal generated by the clock oscillation unit into a control signal of the input delay unit and the output delay unit.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

Figure 1:
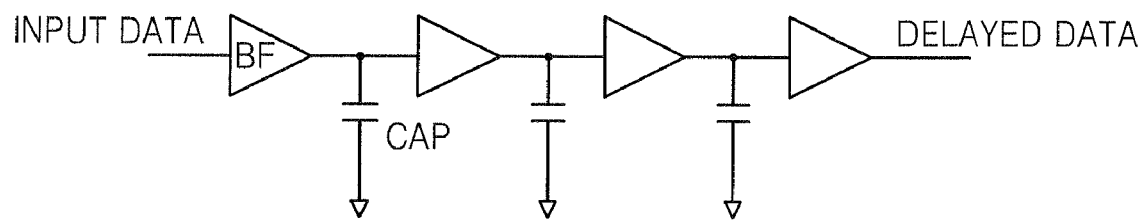
FIG. 1 illustrates a circuit diagram of a conventional data delay circuit using a plurality of buffers.
Figure 2:
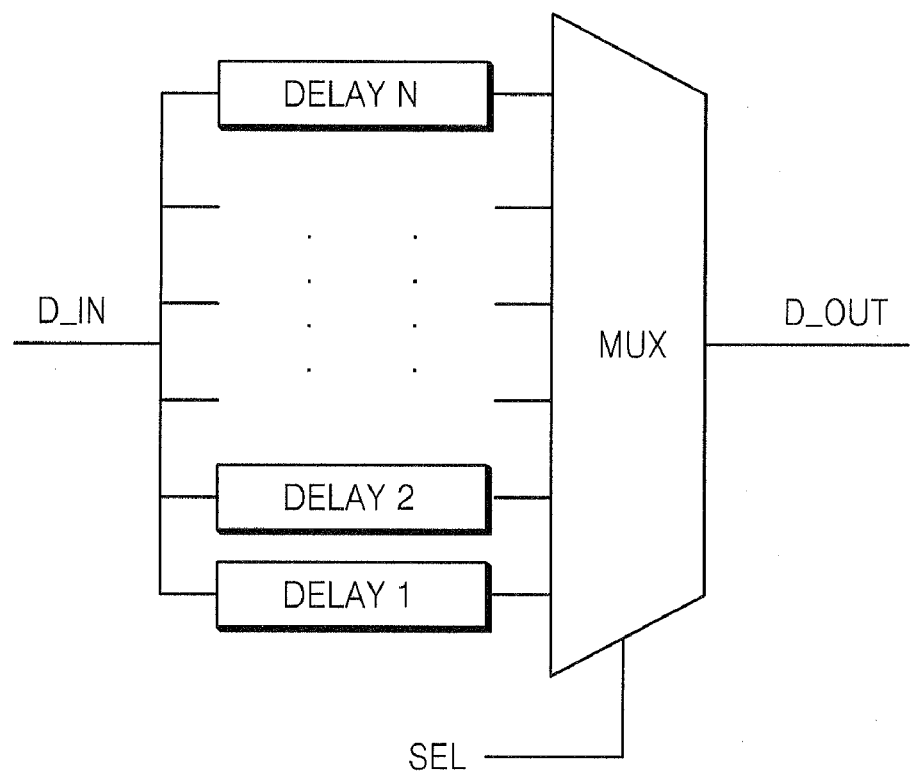
FIG. 2 illustrates a circuit diagram of a conventional data delay control apparatus.

The present invention will now be described more fully with reference to the accompanying drawings, in which exemplary embodiments of the invention are shown. The invention may, however, be embodied in many different forms and should not be construed as being limited to the exemplary embodiments set forth therein; rather, these exemplary embodiments are provided so that this disclosure will be thorough and complete, and will fully convey the concept of the invention to those skilled in the art. Like reference numerals in the drawings denote like elements, and thus their description will not be repeated.

Figure 3:
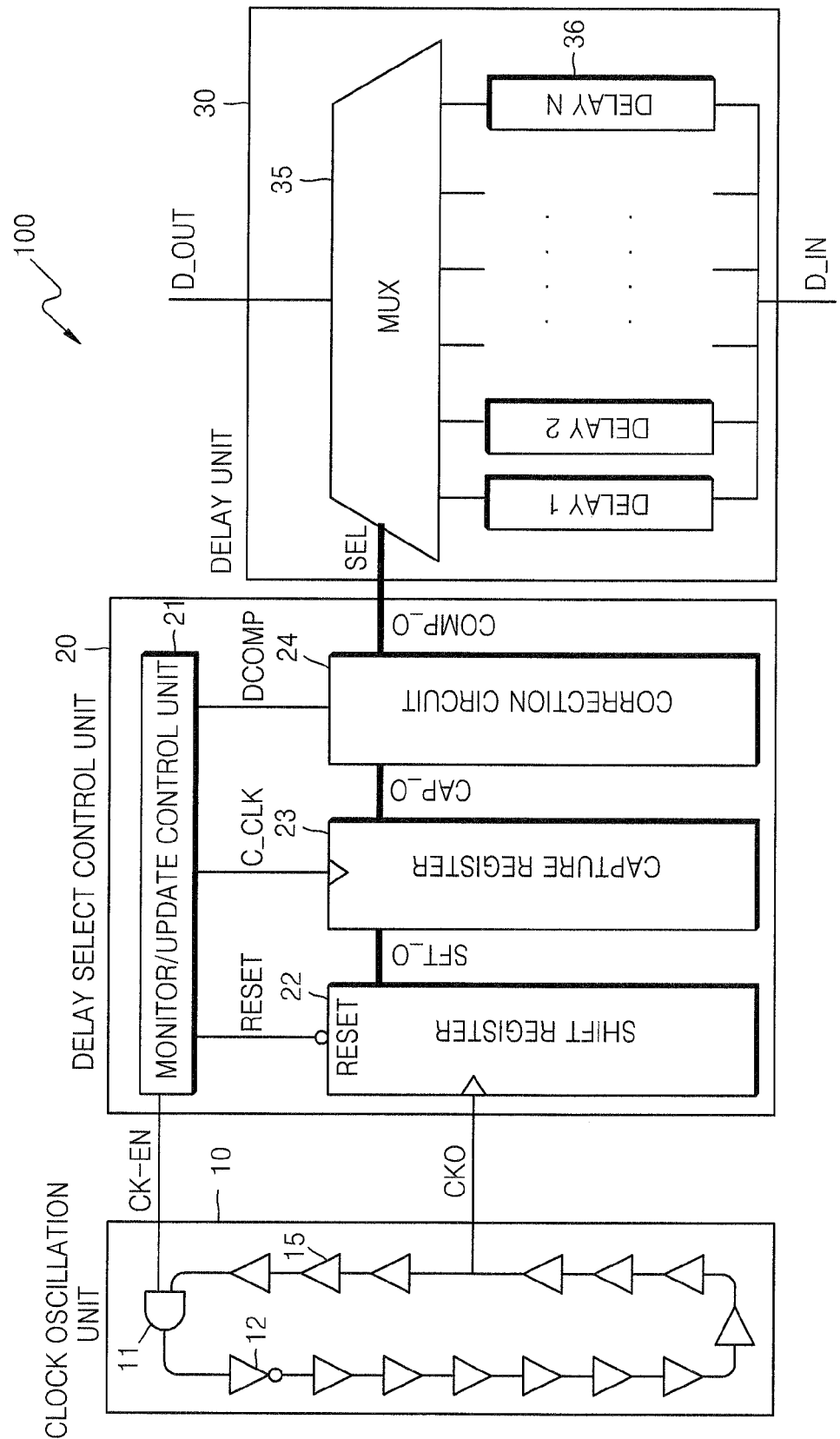
FIG. 3 illustrates a block diagram of a data delay circuit using a shift register according to an exemplary embodiment of the present invention.

FIG. 3 illustrates a block diagram of a data delay circuit 100 using a shift register 22 according to an exemplary embodiment of the present invention.

In other words, FIG. 3 illustrates a simple ring oscillator, that is, a clock oscillation unit 10 generating different clock signals according to changes in an operating environment.

Referring to FIG. 3, when a clock oscillation enable signal CK_EN transits to a logic high level from a logic low level, the clock oscillation unit 10 oscillates using the logic of an AND gate 11. The clock oscillation unit 10 uses a race phenomenon in which a signal is delayed by each buffer in the ring and, thus, the signal is transmitted late. Specifically, a signal, which is inverted by an inverter 12 inserted into the clock oscillation unit 10, is delayed and, thus, the signal is transmitted late. Consequently, an output clock signal CKO is generated. The clock oscillation unit 10 formed of the ring oscillator may use a plurality of buffers 15, the inverter 12 and an additional delay cell (not shown) to adapt according to changes in the operating environment of the operating units of the delay cells used in a delay unit 30.

The frequency of the output clock signal CKO generated by the clock oscillation unit 10 varies according to changes in the operating environment. A change in the frequency of the output clock signal CKO indicates how much the delay period of the delay cell has changed. In the exemplary embodiment of FIG. 3, a delay select control unit 20, which receives the output clock signal CKO, includes a shift register 22. Being synchronized with the output clock signal CKO, the delay select control unit 20 shifts a value of the shift register 22. When clock monitoring is not required, the shift register 22 receives a reset signal RESET output from a monitor/update control unit 21 and maintains a reset state. When the clock enable signal CK_EN is enabled for monitoring, the shift register 22 is shifted after the output clock signal CKO is stabilized. When the clock enable signal CK_EN is disabled and the output clock signal CKO stops oscillating, an output signal SFT_O of the shift register 22 is synchronized with a clock signal C_CLK and is stored in the capture register 23, which in turn generates an output signal CAP_O. The delay select control unit 20 provides a select signal SEL to the delay unit 30 using the output signal CAP_O of the capture register 23. A correction circuit 24 receives the output signal CAP_O of the capture register 23 and provides a final delay select signal COMP_O to the delay unit 30. More specifically, when the shift register 22 is shifted in synchronization with the output clock signal CKO, a register among a plurality of registers (not shown) included in the shift register 22 having a least significant bit (LSB) has logic "1" as a reset value and logic low as an input value. The remaining registers, except for the register having the LSB, have logic "0" as a reset value and receive an output of a shift register in a previous block as an input value.

Therefore, when the shift register shifts in synchronization with the output clock signal CKO, the shift register 22 shifts a value of logic "1" of the LSB to an upper bit register. Consequently, only one register in the shift register 22 has logic "1". In this exemplary embodiment, when the number of bits of the output signal SFT_O of the shift register 22 is 2N bits, where N is a natural number, and the number of bits of the select signal SEL required by the delay unit 30 is N bits, the correction circuit 24 logic ORs every pair of bits from the LSB to the most significant bit (MSB) and outputs the N-bit final delay select signal COMP_O.

Then, the correction circuit 24 sequentially and correspondingly connects the N bits of the final delay select signal COMP_O to those of the select signal SEL for the delay unit 30. More specifically, the LSB of the N-bit final delay select signal COMP_O is connected to the LSB of the select signal SEL for the delay unit 30, and upper bits of the N-bit final delay select signal COMP_O are sequentially and correspondingly connected to those of the select signal SEL for the delay unit 30.

When a longer delay path, in terms of time, is selected from a plurality of delay paths 36 included in the delay unit 30 as the value of the select signal SEL becomes larger, a data signal D_IN input to the delay unit 30 is delayed by a predetermined period of time and output accordingly regardless of the changes in the delay periods of the delay cells included in the delay paths. When an order in which the bits of the final delay select signal COMP_O and those of the select signal SEL for the delay unit 30 are respectively connected to each other is changed, a delay path having a delay period opposite to the changes in the delay periods of the delay cells can be provided.

The correction circuit 24 may be configured in various ways according to the standards for selecting a delay cell. In other words, the correction circuit 24 may be configured according to, for example, whether a delay period will be made smaller or larger when one delay cell is used or when a plurality of delay cells are used in the operating environment.

A clock divider may be interposed between the output terminal of the clock oscillation unit 10 and the input terminal of the shift register 22 to reduce the number of bits required for the shift register 22.

In addition, in order to reduce the number of bits required by the capture register 23, the OR operation described above may be implemented or a logical combination circuit, such as an AND gate or an inverter gate, may be interposed between the output of the shift register 22 and the input to the capture register 23.

Figure 4:
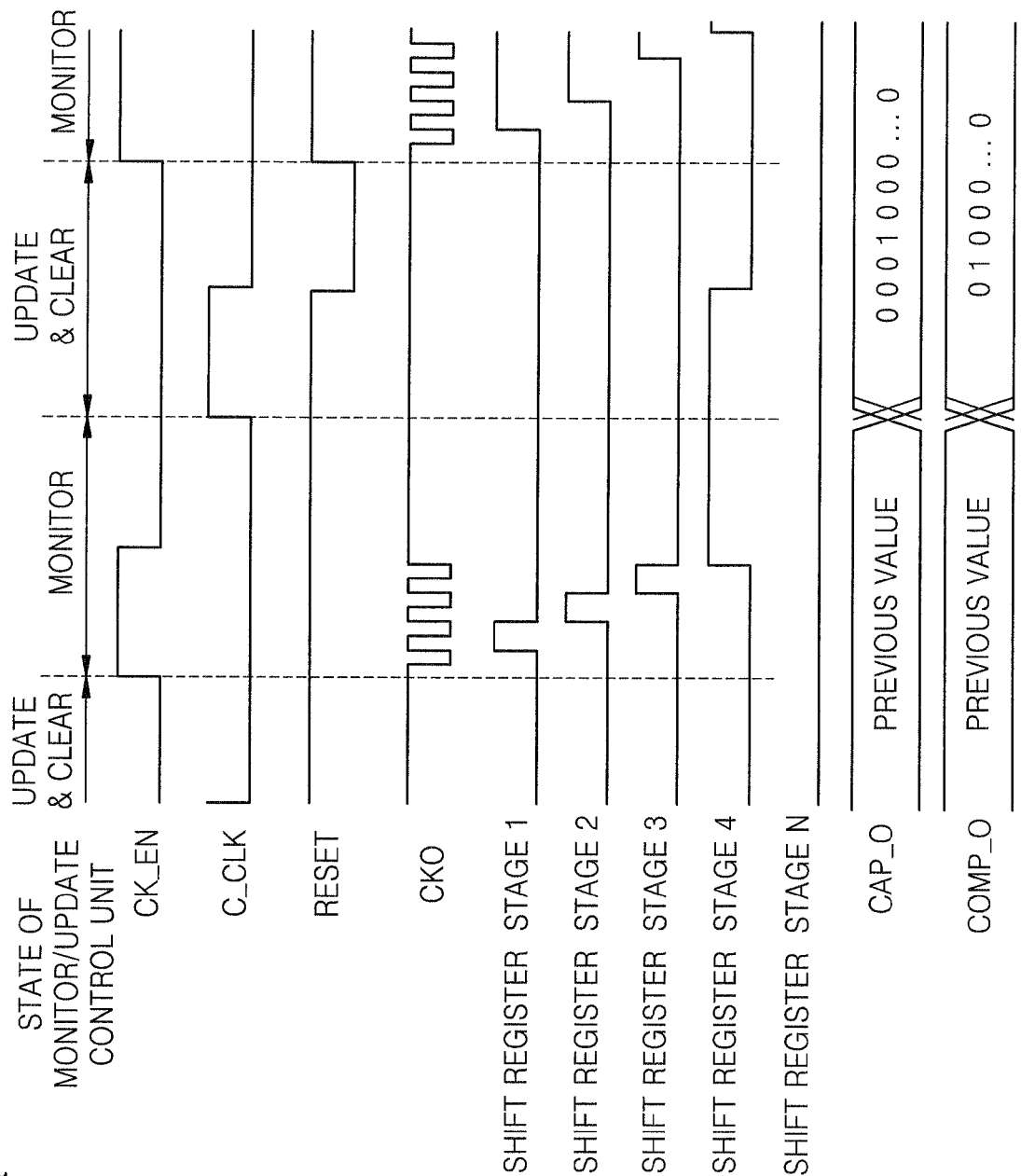
FIG. 4 illustrates a timing diagram of operating signals used in the data delay circuit in FIG. 3.

FIG. 4 is a timing diagram showing the operating signals used in the data delay circuit 100 in FIG. 3.

Referring to FIG. 4, when the clock enable signal CK_EN is logic high, the clock oscillation unit 10 oscillates and generates the output clock signal CKO. The shift register 22 is shifted in synchronism with the output clock signal CKO. In so doing, the LSB of the shift register 22 is sequentially shifted to an upper register with the initial value of logic high of the LSB. After the clock shifting is terminated, the number of clock signal pulses generated for a predetermined clock enable time can be obtained from a result value of the shift register 22. The frequency of the output clock signal CKO generated by the clock oscillation unit 10 can be predicted, and a delay cell can be selected based on the result value of the shift register 22. After clock monitoring, the clock enable signal CK_EN becomes logic low and, accordingly, the clock oscillation unit 10 stops oscillating. Being synchronized with the clock signal C_CLK of the capture register 23, the output signal SFT_O of the shift register 22 is stored in the capture register 23. The correction circuit 24 performs a correction operation based on the output signal CAP_O of the capture register 23 and generates the final delay select signal COMP_O for the delay unit 30. As described above, the correction circuit 24 may generate a select signal in various ways according to requirements. Therefore, a variety of algorithms compensating for the operating environment may be used.

Figure 5:
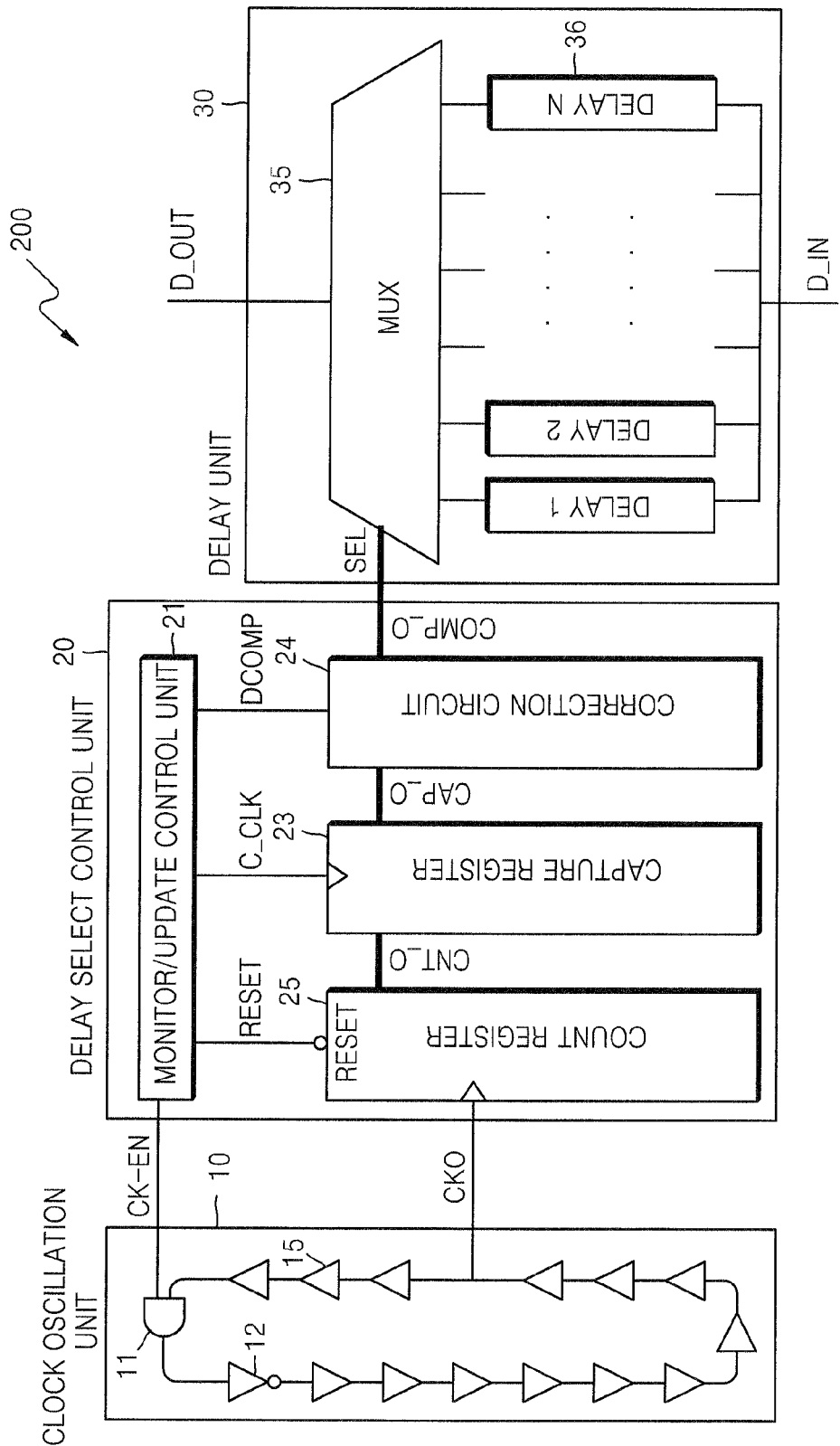
FIG. 5 illustrates a block diagram of a data delay circuit using a count register according to an exemplary embodiment of the present invention.

FIG. 5 is a block diagram of a data delay circuit 200 using a count register 25, according to another embodiment of the present invention.

Referring to FIG. 5, when the output clock signal CKO is monitored using the count register 25, a correction circuit 24 interprets a value of the count register 25 and generates a select signal SEL for a delay unit 30. As in the data delay circuit shown in FIG. 3, when a clock enable signal CK_EN transits to a logic high level from a logic low level, a clock oscillation unit 10 oscillates. Then, the count register 25 counts the number of clock signal pulses in synchronization with the output clock signal CKO generated by the clock oscillation unit 10. When the clock enable signal CK_EN returns to a logic low level, clock monitoring is terminated. The capture register 23 is in synchronization with a clock signal C_CLK from the monitor/update control unit 21, and stores a new value. The correction circuit 24 decodes an output value, that is, an output signal CAP_O from the capture register 23, and finally generates the select signal SEL for the delay unit 30. For example, when the number of bits of the capture register 23 are N bits, where N is a natural number, the number of delay paths included in the delay unit 30 are 2N, the number of bits of the select signal SEL are N bits, and bits of the output signal CAP_O of the capture register 23 are respectively connected to those of the select signal SEL for the delay unit 30. When bits of the output signal CAP_O of the capture register 23 are sequentially and correspondingly connected to those of the select signal SEL for the delay unit 30 from the LSB to the MSB, the frequency of the output clock signal CKO generated by the clock oscillation unit 10 increases in an environment where the delay periods of the delay cells are reduced. The higher the frequency of the output clock signal CKO, the higher the value of the select signal SEL. Hence, when the delay unit 30 having the plurality of delay paths 36 is configured to have longer delays as the value of the select signal SEL increases, the delay period reduced by changes in the operating environment can be compensated for. On the other hand, when the correction circuit 24 connects bits to each other in a reverse order, the delay periods can be compensated for in an opposite way.

As described above, the correction circuit 24 may generate a select signal SEL in various ways according to required purposes. Therefore, a variety of algorithms compensating for the operating environment may be used.

Figure 6:
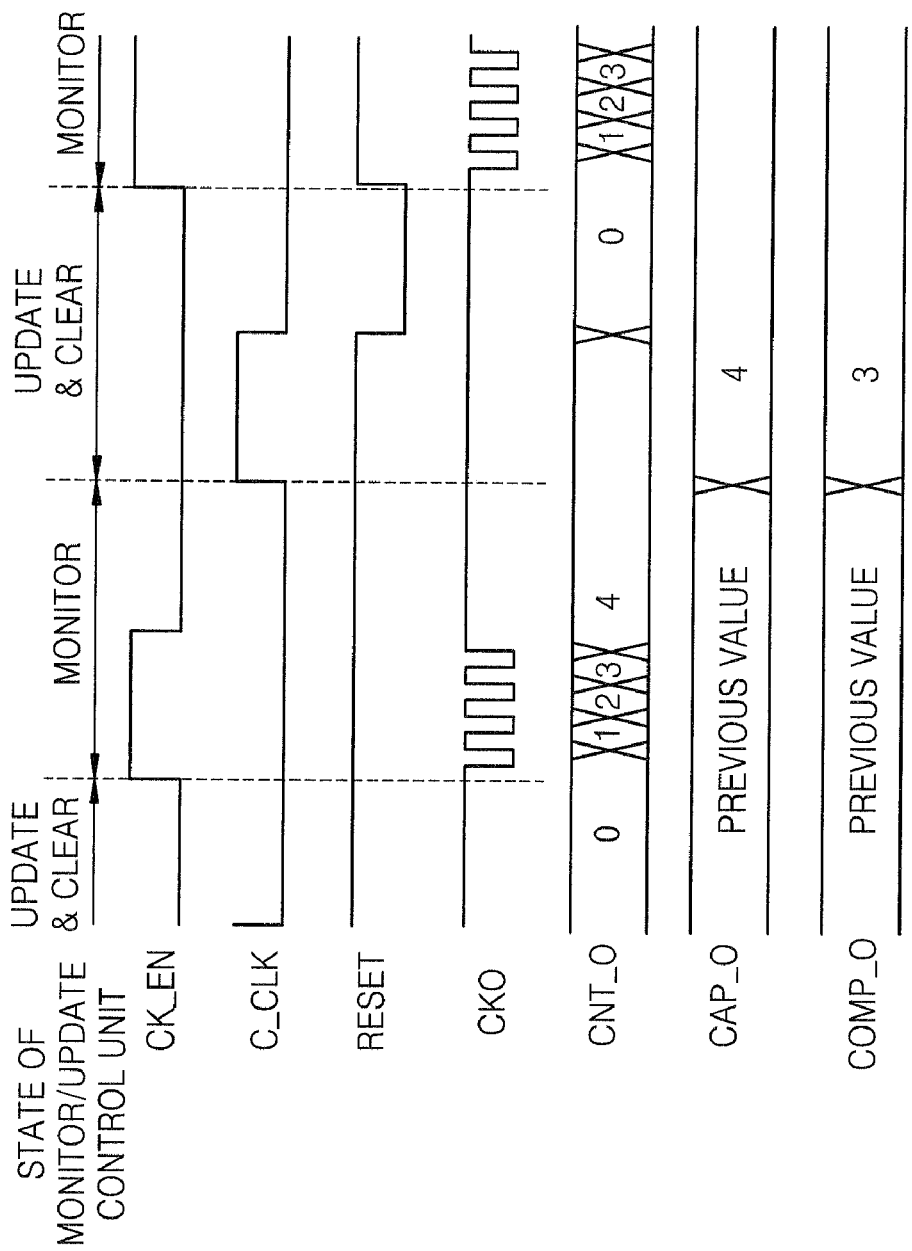
FIG. 6 illustrates a timing diagram of operating signals used in the data delay circuit in FIG. 5.

FIG. 6 is a timing diagram of operating signals used in the data delay circuit 200 in FIG. 5.

Referring to FIG. 6, when the clock enable signal CK_EN is logic high, the clock oscillation unit 10 oscillates and generates the output clock signal CKO. The count register 25 is shifted in synchronization with the output clock signal CKO while counting the number of clock signal pulses generated for a predetermined period of time. After the clock enable signal CK_EN transits to a low logic level from a high logic level, the number of clock signal pulses generated for a predetermined clock enable time can be obtained from a result value of the count register 25. The frequency of the output clock signal CKO generated by the clock oscillation unit 10 can be predicted and a delay cell can be selected based on the result value of the count register 25. After clock monitoring, the clock enable signal CK_EN becomes logic low and, thus, the clock oscillation unit 10 stops oscillating. Being synchronized with the clock signal C_CLK, an output signal CNT_O of the count register 25 is stored in the capture register 23. The correction circuit 24 performs a correction operation based on the output signal CAP_O of the capture register 23, generates a correction signal COMP 0, and connects the correction signal COMP_O correspondingly to the select signal SEL for the delay unit 30. As described above, the correction circuit 24 may generate a select signal SEL in various ways according to requirements of the operating environment. Therefore, a variety of algorithms compensating for the operating environment may be applied.

Figure 7:
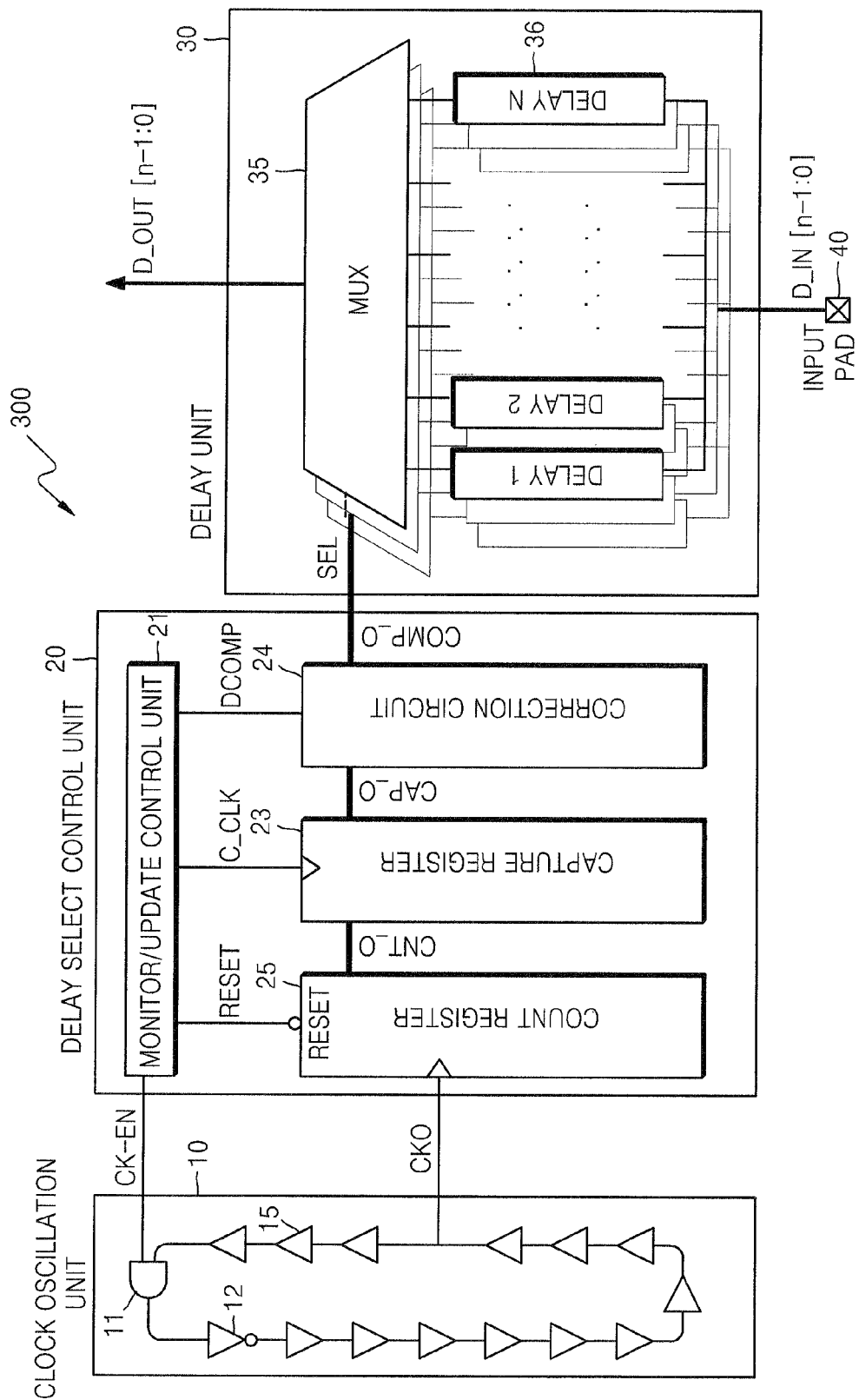
FIG. 7 illustrates a block diagram of a data delay circuit applied to an input pad of a semiconductor chip, according to an exemplary embodiment of the present invention.

FIG. 7 illustrates a block diagram of a data delay circuit 300 applied with an input pad 40 of a semiconductor chip, according to an exemplary embodiment of the present invention.

Figure 8:
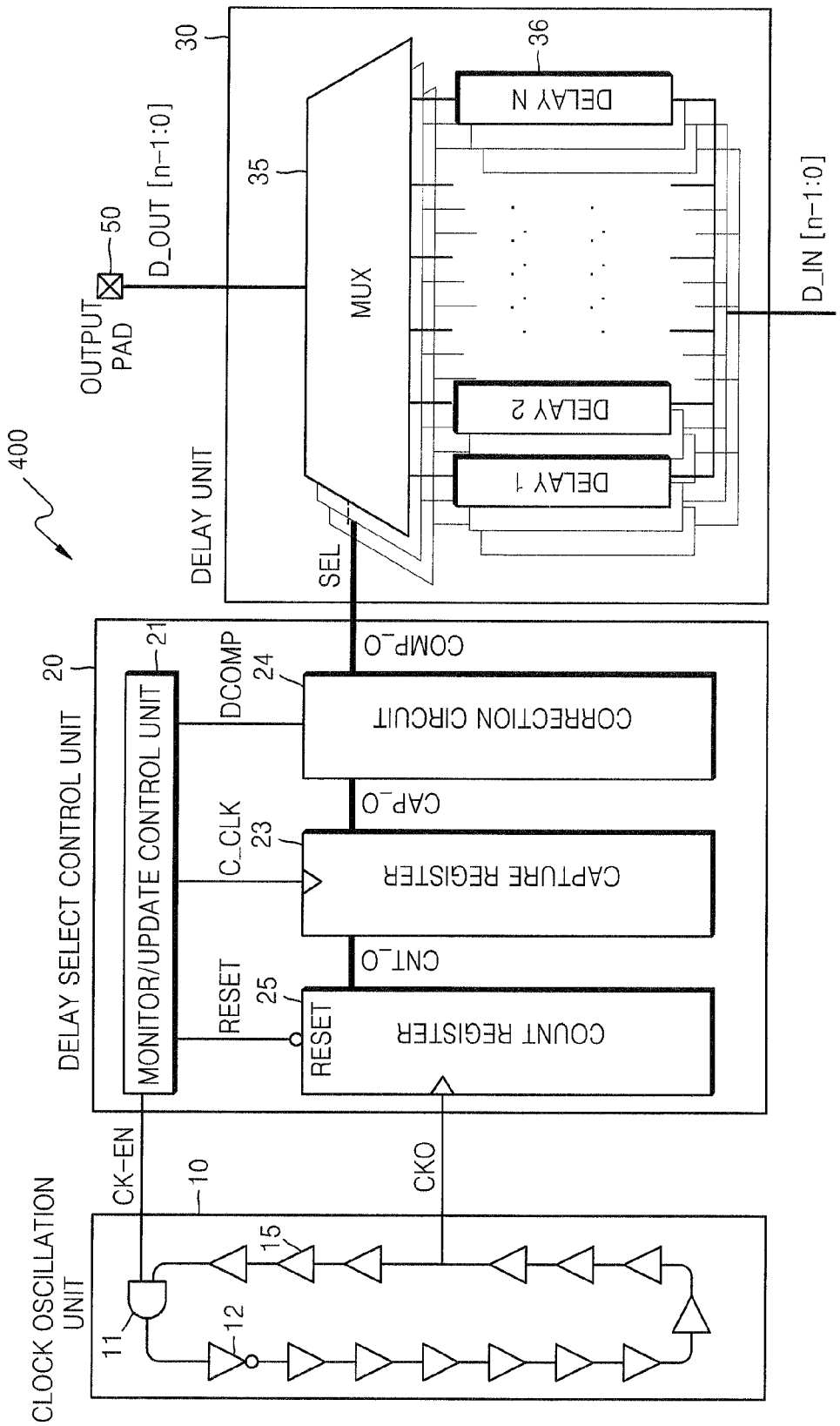
FIG. 8 illustrates a block diagram of the data delay circuit applied to an output pad of the semiconductor chip, according to an exemplary embodiment of the present invention.

FIG. 8 illustrates a block diagram of the data delay circuit applied to an output pad 50 of the semiconductor chip, according to an exemplary embodiment of the present invention.

Referring to FIGS. 7 and 8, the delay period of a signal input through the input pad 40 is corrected to a desired length by considering a delay signal between semiconductor chips. When it is required to readjust the amount of delay of a signal transmitted to another semiconductor chip via the output pad 50, the delay signal is also corrected accordingly. When a signal is transmitted through a printed circuit board (PCB) (not shown) having the semiconductor chip, the signal is delayed by the output pad 50, the PCB, and the input pad 40. Therefore, if the period of the delayed signal is not within an operating range, the semiconductor chip may not operate properly. In this regard, when the delay circuit suitable for the operating environment is implemented in the input pad 40 or the output pad 50, the possibility of unstable operation of the semiconductor due to a delay signal depending on changes in the operating environment can be removed. The method of controlling the delay period of data has been described above with reference to FIGS. 3 and 5. When the delay circuit according to an exemplary embodiment of the present invention is used, the delay period of the data, which needs to be adjusted by the input pad 40 and the output pad 50, can be automatically adjusted. For example, when the delay period within a semiconductor chip becomes larger due to the operating environment of the semiconductor chip, a delay path having a larger delay period can be selected when a signal is input to an input terminal relatively faster. Conversely, when a signal is input from the input terminal relatively slower, a delay path having a smaller delay period can be selected.

Figure 9:
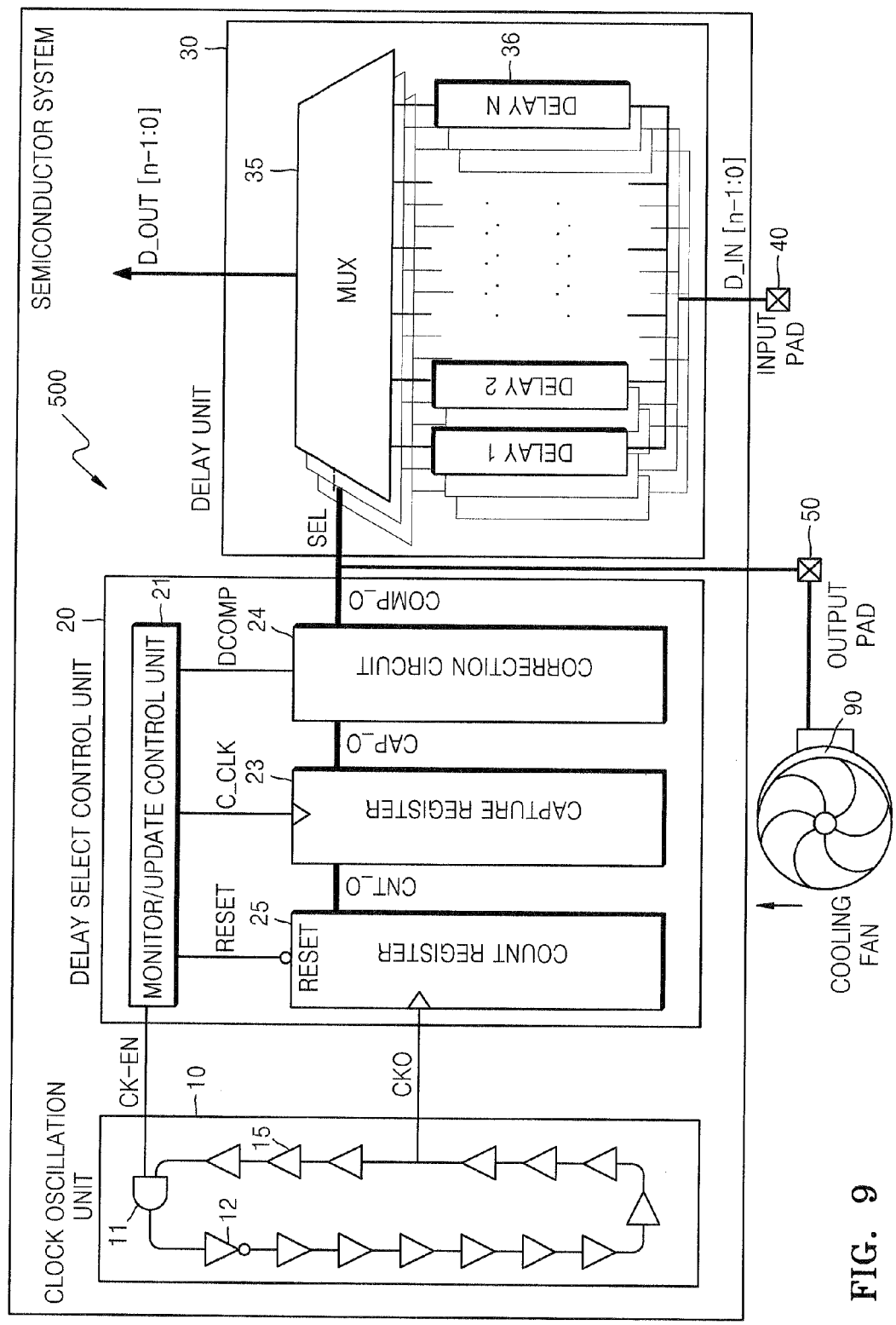
FIG. 9 illustrates a block diagram of a data delay circuit using an external cooling fan, according to an exemplary embodiment of the present invention.

FIG. 9 illustrates a block diagram of a data delay circuit 500 using an external cooling fan 90, according to an exemplary embodiment of the present invention.

In other words, a delay select control unit 20 not only generates a select signal SEL for a delay unit 30 but also outputs the select signal SEL outside of a semiconductor chip. In the exemplary embodiment, the delay select control unit 20 adjusts the delay of a delay signal to have a desired delay period by controlling the cooling fan 90 and a temperature control apparatus (not shown).

Referring to FIG. 9, a correction circuit 24 monitors an output clock signal CKO of a clock oscillation unit 10 and generates the select signal SEL for a delay cell of a delay unit 30. Additionally, the correction circuit 24 generates a signal for controlling the external cooling fan 90 to maintain an operating temperature within a predetermined range. Therefore, the correction circuit 24 can generate a delay signal having a desired delay period through temperature compensation and delay cell selection. The number of delay cells selected can be reduced and the delay period of input data can be adjusted as desired by additionally controlling the external cooling fan 90 as described above.

Figure 10:
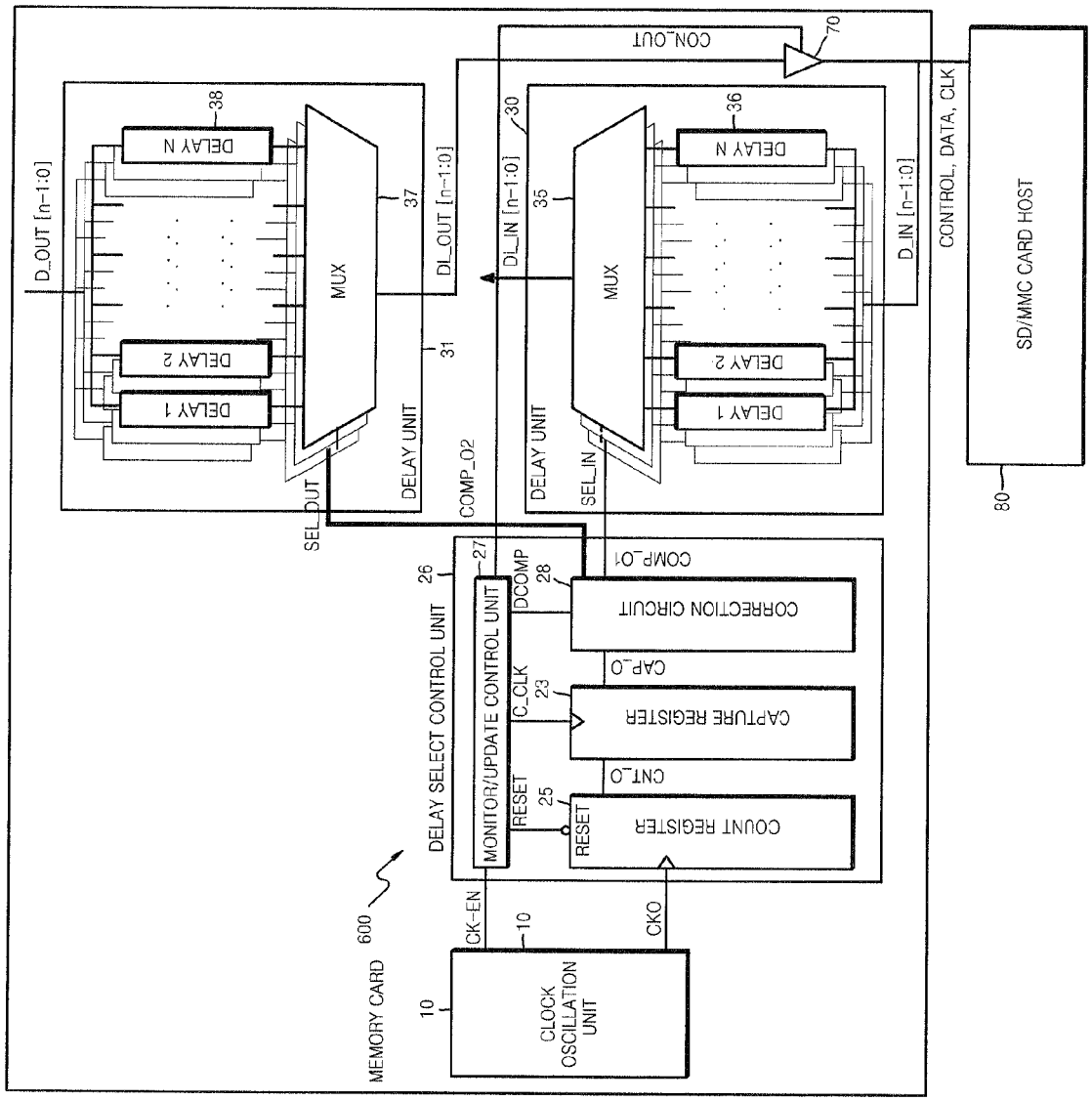
FIG. 10 is a block diagram illustrating an example of controlling the delay periods of input and output data of a memory card according to an exemplary embodiment of the present invention.

FIG. 10 is a block diagram illustrating an example of controlling the delay periods of input and output data of a memory card 600 according to an exemplary embodiment of the present invention.

Referring to FIG. 10, a delay control circuit according to an exemplary embodiment of the present invention is applied to the memory card 600. Recently, memory cards are receiving a lot of attention in terms of interoperability between delay periods of delay signals of input and output data. Since memory cards internally compensate for the delay periods of input and output signals, a complicated control is not required. Generally, the input and output signals of memory cards include a data signal, a clock signal, and a read/write control signal. The delay periods of the input and output signals can vary according to a manufacturing process, an operating voltage, and an operating temperature. Furthermore, since interoperability between memory cards and memory hosts manufactured by various companies is very important, the delay of the input and output signals is a very important factor in guaranteeing stable operation. When the data delay circuit according to an exemplary embodiment of the present invention is used in input and output pads of the memory card, the operating environment can be monitored without the intervention from a CPU and a delay signal can be automatically generated as intended.

In addition, referring to FIG. 10, the memory card 600 includes an input delay unit 30 and an output delay unit 31 that are separately provided. Therefore, in the exemplary embodiment, the memory card 600 separately controls the delay periods of signals input and output via the input and output pads (not shown) of the memory card 600. The input delay unit 30 and the output delay unit 31 respectively control the delay periods of the input and output signals using an input delay select signal SEL_IN and an output delay select signal SEL_OUT generated by a delay select control unit 26. The control method of the delay select control unit 26 has been described above with reference to FIGS. 3 and 5 in relation to the delay select control unit 20.

Figure 11:
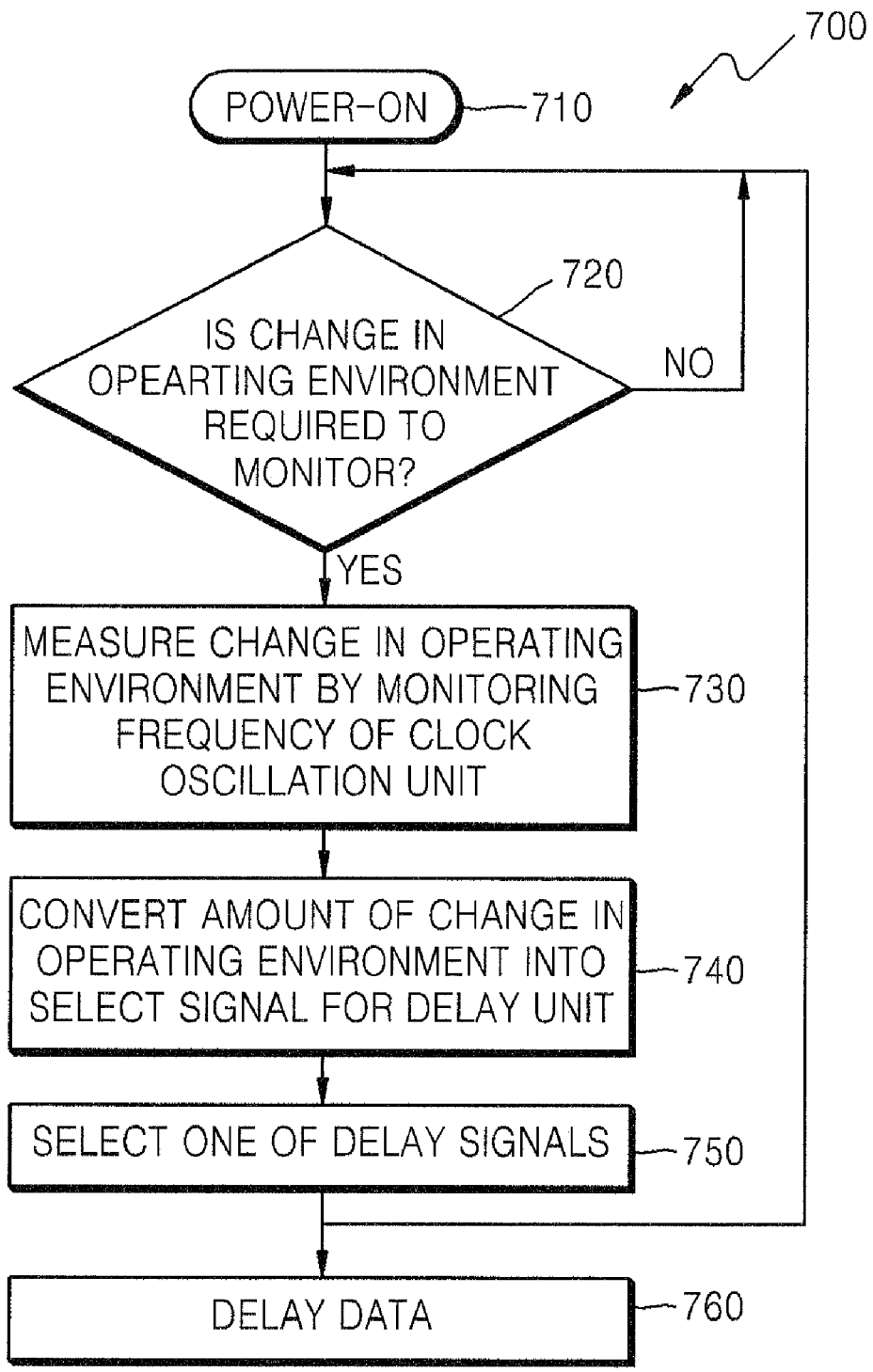
FIG. 11 is a flowchart illustrating a data delay method according to an exemplary embodiment of the present invention.

FIG. 11 is a flowchart illustrating a data delay method 700 according to an embodiment of the present invention.

Referring to FIG. 11, when an operating environment changes after a control signal is enabled, it is determined whether a select signal for a delay unit needs to be updated (operation 720), and if so the change in the operating environment is measured (operation 730). After the change in the operating environment is measured, the amount of change in the operating environment is converted into a control signal of the delay unit (operation 740). The generated control signal is connected to the select signal for the delay unit to select one of a plurality of delay paths included in the delay unit (operation 750). The selected delay path delays a data signal (operation 760). Whenever the select signal for the delay unit needs to be updated according to changes in the operating environment, the above process is repeated.

Figure 12:
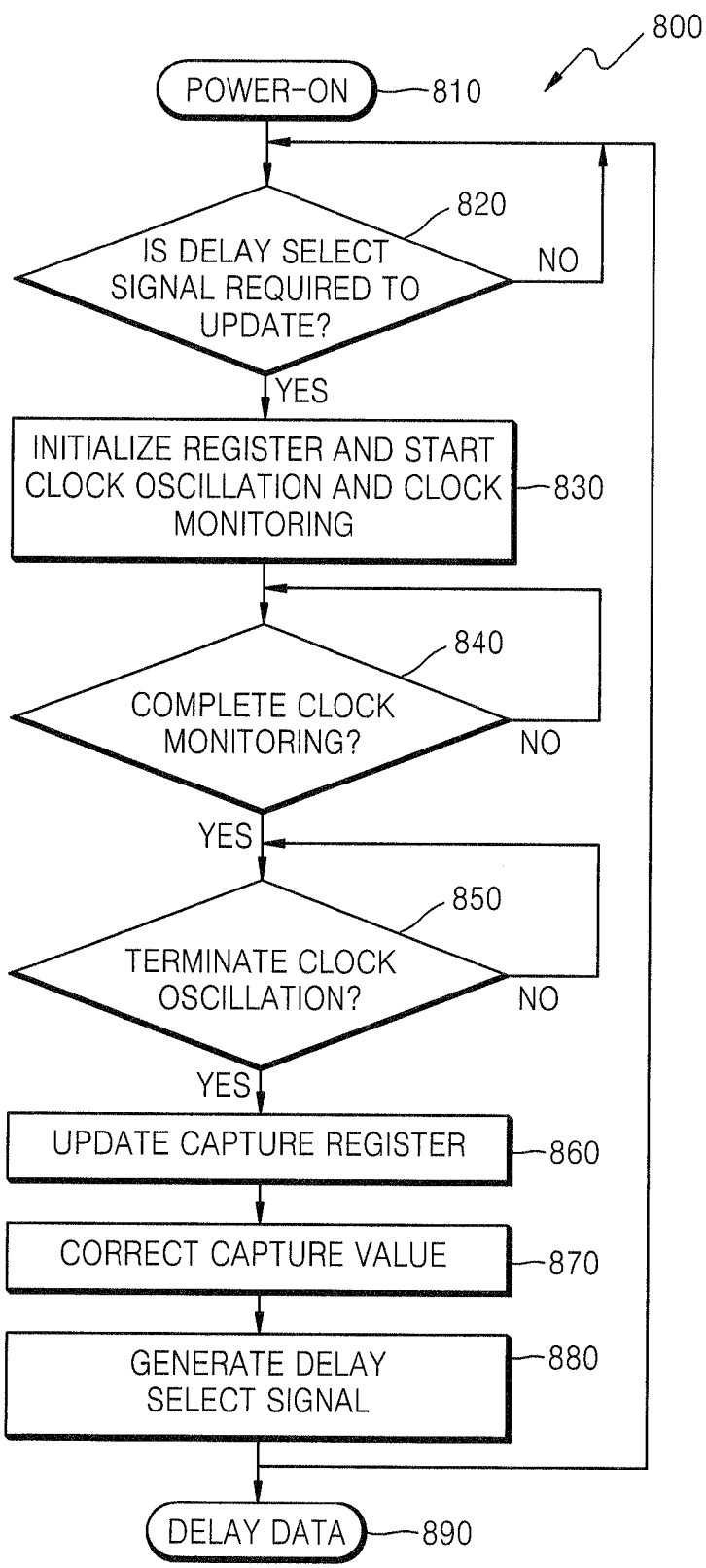
FIG. 12 is a flowchart illustrating the data delay method illustrated in FIG. 11 in more detail, according to an exemplary embodiment of the present invention.

FIG. 12 is a flowchart illustrating in more detail a data delay method 800 such as the data delay method illustrated in FIG. 11, according to an exemplary embodiment of the present invention.

Referring to FIG. 12, when it is determined that a selected signal for a delay unit needs to be updated (operation 820), a clock frequency monitoring circuit (not shown) of the clock oscillation unit 10 is initialized, and the clock oscillation unit 10 is enabled (operation 830). After the frequency of the output clock signal CKO of the clock oscillation unit 10 is monitored (operation 840), the clock oscillation unit 10 is disabled (operation 850), and the capture register 23 is updated (operation 860). A correction operation is performed based on an output of the capture register 23 (operation 870), and a delay select signal is generated (operation 880). Thereafter, whenever the select signal for the delay unit needs to be updated according to changes in the operating environment, the above process is repeated.

As described above, exemplary embodiments of the present invention can automatically select a desired delay path from a plurality of delay paths using the clock oscillation unit 10, which generates a clock signal depending on the changes in the operating environment, thereby controlling a delay period of data.

As described above, exemplary embodiments of the present invention can generate an expected delay value regardless of the changes in an operating environment (such as temperature, voltage and a manufacturing process) of semiconductor chips included in a semiconductor device when the semiconductor chips are designed. In addition, exemplary embodiments of the present invention can selectively control an interface condition with an external system. In this regard, products that can stably operate in various modes and environments can be manufactured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory card comprising:
    an oscillation unit sensing a change in an operating environment and generating a clock signal with a varying frequency according to the sensed change in the operating environment;
    an input delay unit delaying an input data signal through a plurality of input delay cells coupled in parallel to an input selector;
    an output delay unit delaying an output data signal through a plurality of output delay cells coupled in parallel to an output selector; and
    a delay select control unit converting a change in the clock signal generated by the oscillation unit into an input delay unit control signal and an output delay unit control signal.

2. The memory card of claim 1, wherein the oscillation unit is a ring oscillator generating the clock signal with a lower frequency as a temperature of the operating environment increases.

3. The memory card of claim 1, wherein the input delay unit delays a host provided clock signal, a host provided data signal, or a host provided control signal input from a memory host to the memory card.

4. The memory card of claim 1, wherein the output delay unit delays the output data signal output from the memory card to a memory host.

5. The memory card of claim 1, wherein the change in the operating environment comprises any one of a manufacturing process, an operating temperature, and an operating voltage of a semiconductor.

* * * * *